United States Patent
Yamauchi

(10) Patent No.: US 11,082,027 B2
(45) Date of Patent: Aug. 3, 2021

(54) ACOUSTIC WAVE DEVICE

(71) Applicant: TAIYO YUDEN CO., LTD., Tokyo (JP)

(72) Inventor: Motoi Yamauchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 670 days.

(21) Appl. No.: 15/885,276

(22) Filed: Jan. 31, 2018

(65) Prior Publication Data

US 2018/0219527 A1    Aug. 2, 2018

(30) Foreign Application Priority Data

Feb. 2, 2017 (JP) .............................. JP2017-017850
Feb. 7, 2017 (JP) .............................. JP2017-020744

(51) Int. Cl.
| | |
|---|---|
| *H03H 9/02* | (2006.01) |
| *H03H 9/05* | (2006.01) |
| *H03H 9/13* | (2006.01) |
| *H03H 9/145* | (2006.01) |
| *H01L 41/187* | (2006.01) |

(52) U.S. Cl.
CPC ..... *H03H 9/02897* (2013.01); *H01L 41/1873* (2013.01); *H03H 9/05* (2013.01); *H03H 9/059* (2013.01); *H03H 9/0523* (2013.01); *H03H 9/0547* (2013.01); *H03H 9/13* (2013.01); *H03H 9/145* (2013.01)

(58) Field of Classification Search
CPC .. H01L 41/1873; H03H 9/02897; H03H 9/05; H03H 9/059; H03H 9/0523; H03H 9/0547; H03H 9/13; H03H 9/145

USPC ...................................................... 310/348
See application file for complete search history.

(56) References Cited

U.S. PATENT DOCUMENTS

| | | | |
|---|---|---|---|
| 2002/0101304 A1* | 8/2002 | Onishi | ................ H03H 9/1085 |
| | | | 333/193 |
| 2007/0058003 A1 | 3/2007 | Aoki | |
| 2007/0115079 A1 | 5/2007 | Kubo et al. | |
| 2009/0224851 A1 | 9/2009 | Feiertag et al. | |
| 2015/0042207 A1 | 2/2015 | Hori et al. | |

(Continued)

FOREIGN PATENT DOCUMENTS

| | | |
|---|---|---|
| JP | 54-69048 A | 6/1979 |
| JP | 11-330899 A | 11/1999 |

(Continued)

OTHER PUBLICATIONS

Japanese Office Action dated Feb. 12, 2019, in a counterpart Japanese patent application No. 2017-017850. (A machine translation (not reviewed for accuracy) attached.).

*Primary Examiner* — Shawki S Ismail
*Assistant Examiner* — Monica Mata
(74) *Attorney, Agent, or Firm* — Chen Yoshimura LLP

(57) ABSTRACT

An acoustic wave device includes: a first substrate made of a piezoelectric material; an acoustic wave element located on the first substrate; a bump located on the first substrate; a second substrate located on the first substrate through the bump, the second substrate facing the first substrate across an air gap; and a support layer that is located in at least a part of a periphery of the first substrate, is in contact with a side surface of the first substrate, and has a less linear thermal expansion coefficient than the first substrate.

11 Claims, 15 Drawing Sheets

(56) References Cited

U.S. PATENT DOCUMENTS

2017/0250669 A1    8/2017  Kuroyanage et al.
2019/0288667 A1*   9/2019  Hayashi .............. H01L 41/1873

FOREIGN PATENT DOCUMENTS

| | | |
|---|---|---|
| JP | 2003-17980 A | 1/2003 |
| JP | 2005-223580 A | 8/2005 |
| JP | 2007-81867 A | 3/2007 |
| JP | 2008-546207 A | 12/2008 |
| JP | 2010-251827 A | 11/2010 |
| JP | 2017-152870 A | 8/2017 |
| JP | 2017-157922 A | 9/2017 |
| JP | 2017-158160 A | 9/2017 |
| WO | 2006/008940 A1 | 1/2006 |
| WO | 2008/152837 A1 | 12/2008 |
| WO | 2014/156507 A1 | 10/2014 |

* cited by examiner

FIG. 3A

| PIEZOELECTRIC SUBSTRATE 10 | MATERIAL | Lx1 | Ly1 | | |
|---|---|---|---|---|---|
| | LT/SAPPHIRE | 0.78 mm | 0.98 mm | | |
| SUBSTRATE 20 | MATERIAL | Lx2 | Ly2 | T3 | |
| | Si | 0.6 mm | 0.8 mm | 0.15 mm | |
| BUMP 30 | MATERIAL | Lx3 | Ly3 | $\phi$ | H1 |
| | Au | 123 $\mu$m | 70 $\mu$m | 80 $\mu$m | 15 $\mu$m |
| EMBEDDED LAYER 35 | W1 | | | | |
| | 55 $\mu$m | | | | |

FIG. 3B

| | CROSS-SECTION | PLANE | T1 [$\mu$m] | T2 [$\mu$m] | MATERIAL OF EMBEDDED LAYER |
|---|---|---|---|---|---|
| SAMPLE 1 | A | A | 120 | – | – |
| SAMPLE 2 | B | B | 20 | 100 | W |
| SAMPLE 3 | B | C | 30 | 90 | W |
| SAMPLE 4 | C | B | 20 | 100 | Cu |
| SAMPLE 5 | C | C | 20 | 100 | W |
| SAMPLE 6 | C | B | 20 | 100 | W |
| SAMPLE 7 | C | C | 10 | 110 | W |
| SAMPLE 8 | C | B | 10 | 110 | W |

FIG. 4

|  | YOUNG'S MODULUS [Pa] | POISSON'S RATIO | LINEAR THERMAL EXPANSION COEFFICIENT [/°C] | |
|---|---|---|---|---|
| Au | $7.72 \times 10^{10}$ | 0.42 | $1.44 \times 10^{-5}$ | |
| Cu | $7.7 \times 10^{10}$ | 0.343 | $1.77 \times 10^{-5}$ | |
| LT | $2.54 \times 10^{11}$ | 0.21 | X | $1.61 \times 10^{-5}$ |
| | | | Y | $9.50 \times 10^{-6}$ |
| | | | Z | $1.07 \times 10^{-5}$ |
| SAPPHIRE | $4.7 \times 10^{11}$ | 0.25 | $7.00 \times 10^{-6}$ | |
| Si | $1.1 \times 10^{11}$ | 0.27 | $2.30 \times 10^{-6}$ | |
| W | $4.0 \times 10^{11}$ | 0.28 | $4.40 \times 10^{-6}$ | |

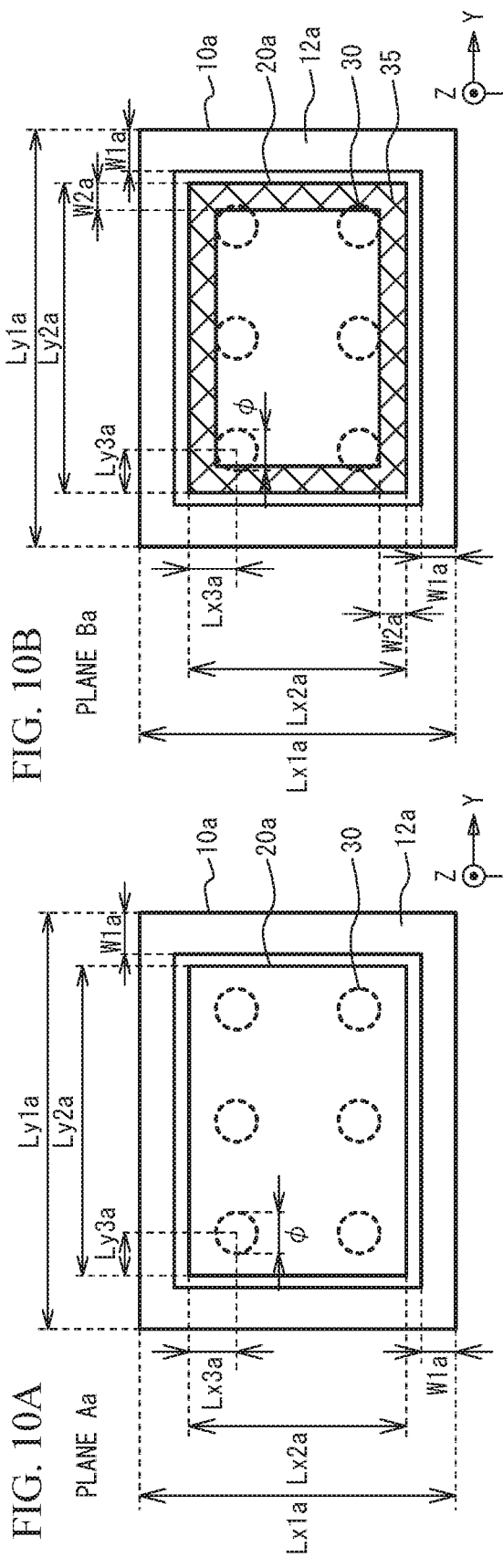
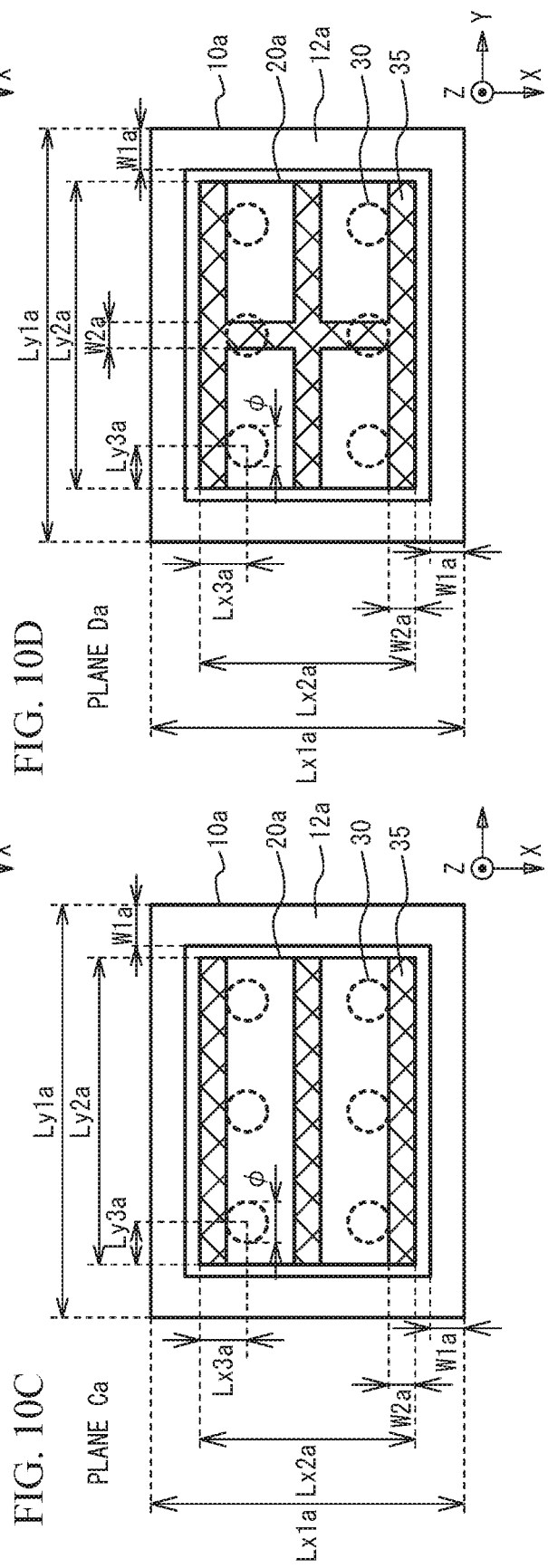
FIG. 10A PLANE Aa
FIG. 10B PLANE Ba
FIG. 10C PLANE Ca
FIG. 10D PLANE Da

FIG. 11A

| SUBSTRATE 10c | MATERIAL | Lx1a | Ly1a | T1a | |
|---|---|---|---|---|---|
| | HTCC | 0.78 mm | 0.98 mm | 0.12 mm | |
| SUBSTRATE 20a | MATERIAL | Lx2 | Ly2 | T3 | |
| | LT | 0.66 mm | 0.86 mm | 0.15 mm | |
| BUMP 30 | MATERIAL | Lx3a | Ly3a | φ | H1a |
| | Au | 155 μm | 130 μm | 80 μm | 15 μm |
| RING-SHAPED METAL LAYER 12a | MATERIAL | W1a | T2a | | |
| | W | 55 μm | 20 μm | | |
| EMBEDDED LAYER 35 | MATERIAL | W2a | T4a | | |
| | W | 55 μm | 30 μm | | |

FIG. 11B

| | CROSS-SECTION | PLANE |
|---|---|---|
| SAMPLE 1a | Aa | Aa |
| SAMPLE 2a | Ba | Ba |
| SAMPLE 3a | Ba | Ca |
| SAMPLE 4a | Ba | Da |

FIG. 12

|  | YOUNG'S MODULUS [Pa] | POISSON'S RATIO | LINEAR THERMAL EXPANSION COEFFICIENT [/°C] | |
|---|---|---|---|---|
| Au | $7.72 \times 10^{10}$ | 0.42 | $1.44 \times 10^{-5}$ | |
| LT | $2.54 \times 10^{11}$ | 0.21 | X | $1.61 \times 10^{-5}$ |
|  |  |  | Y | $9.50 \times 10^{-6}$ |
|  |  |  | Z | $1.07 \times 10^{-5}$ |
| HTCC | $3.1 \times 10^{11}$ | 0.24 | $7.10 \times 10^{-6}$ | |
| W | $4.0 \times 10^{11}$ | 0.28 | $4.40 \times 10^{-6}$ | |

ACOUSTIC WAVE DEVICE

CROSS-REFERENCE TO RELATED APPLICATION

This application is based upon and claims the benefit of priority of the prior Japanese Patent Application No. 2017-017850, filed on Feb. 2, 2017, and the prior Japanese Patent Application No. 2017-020744, filed on Feb. 7, 2017, the entire contents of which are incorporated herein by reference.

FIELD

A certain aspect of the present invention relates to an acoustic wave device.

BACKGROUND

It has been known to flip-chip mount a substrate onto the upper surface of a piezoelectric substrate having an acoustic wave element formed on the upper surface thereof with use of bumps as a packaging method of an acoustic wave device as disclosed in Japanese Patent Application Publication No. 2008-546207.

SUMMARY OF THE INVENTION

According to an aspect of the present invention, there is provided an acoustic wave device including: a first substrate made of a piezoelectric material; an acoustic wave element located on the first substrate; a bump located on the first substrate; a second substrate located on the first substrate through the bump, the second substrate facing the first substrate across an air gap; and a support layer that is located in at least a part of a periphery of the first substrate, is in contact with a side surface of the first substrate, and has a less linear thermal expansion coefficient than the first substrate.

BRIEF DESCRIPTION OF THE DRAWINGS

FIG. 3A and FIG. 3B present materials and dimensions of the samples used for the simulation;

FIG. 4 presents the Young's modulus, the Poisson's ratio, and the linear thermal expansion coefficient of each material used for the simulation;

FIG. 10A through FIG. 10D are plan views of the other samples used for the simulation;

FIG. 11A and FIG. 11B present materials and dimensions of the other samples used for the simulation;

FIG. 12 presents the Young's modulus, the Poisson's ratio, and the linear thermal expansion coefficient of each material used for the simulation;

DETAILED DESCRIPTION

The piezoelectric substrate has a large linear thermal expansion coefficient. Thus, a stress is applied to bumps. The application of stress may break the bumps.

Figure 1A:
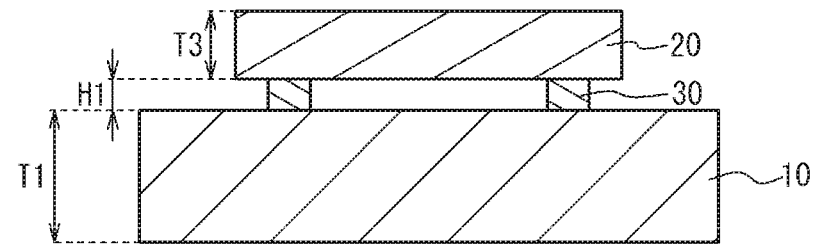
FIG. 1A through FIG. 1C are cross-sectional views of samples used for a simulation.
Figure 1B:
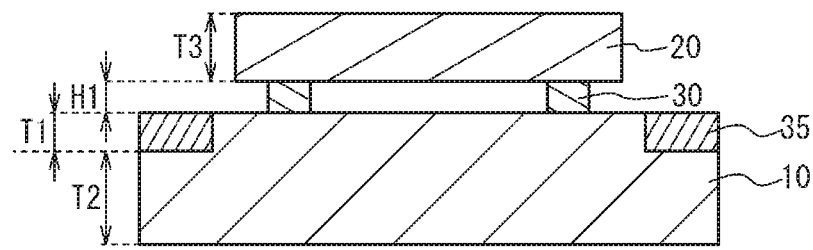
Figure 1C:
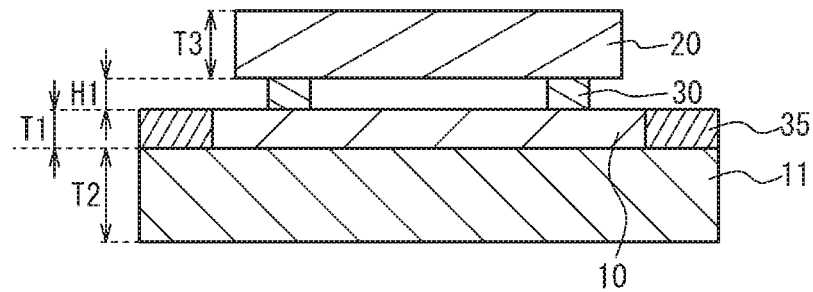

A stress applied to a bump was simulated for samples in which a substrate is flip-chip mounted on a piezoelectric substrate. FIG. 1A through FIG. 1C are cross-sectional views of samples used for a simulation. As illustrated in FIG. 1A, in a cross-section A, a substrate 20 is flip-chip mounted on a piezoelectric substrate 10 with use of bumps 30. The piezoelectric substrate 10 has a thickness of T1, the substrate 20 has a thickness of T3, and the bump 30 has a height of H1.

As illustrated in FIG. 1B, in a cross-section B, an embedded layer 35 is embedded in the periphery of the piezoelectric substrate 10. The embedded layer 35 has a thickness of T1. The thickness calculated by subtracting the thickness of the embedded layer 35 from the thickness of the piezoelectric substrate 10 is T2. Other structures are the same as those of the cross-section A.

As illustrated in FIG. 1C, in a cross-section C, the lower surface of the piezoelectric substrate 10 is bonded on the upper surface of a support substrate 11. The embedded layer 35 has a thickness of T1, which is the same as the thickness of the piezoelectric substrate 10. The support substrate 11 has a thickness of T2. Other structures are the same as those of the cross-section B.

Figure 2A:
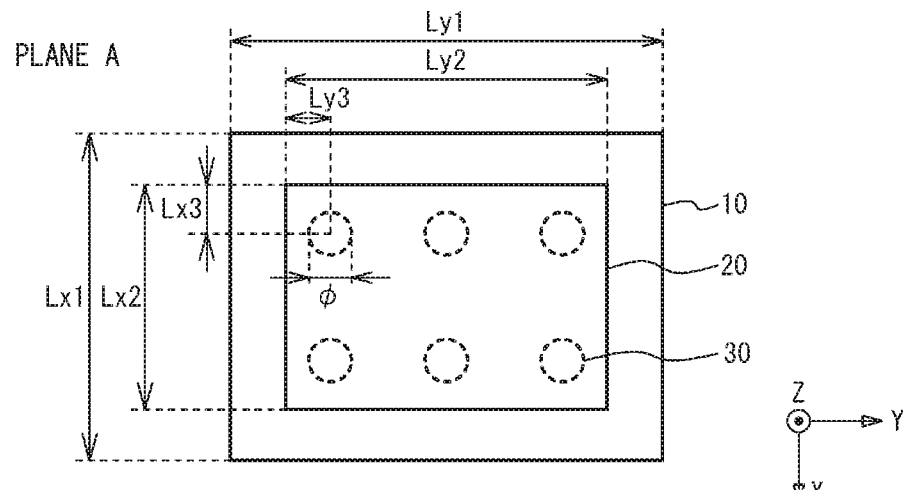
FIG. 2A through FIG. 2C are plan views of the samples used for the simulation.
Figure 2B:
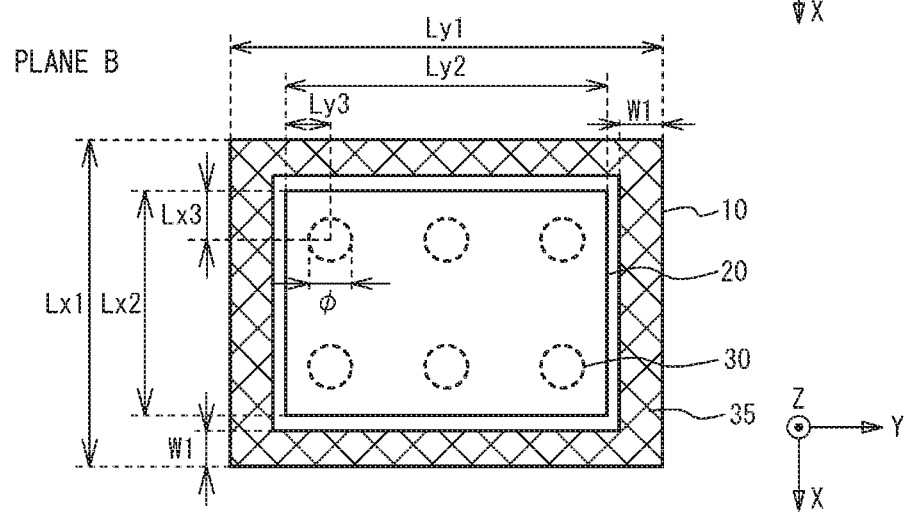
Figure 2C:
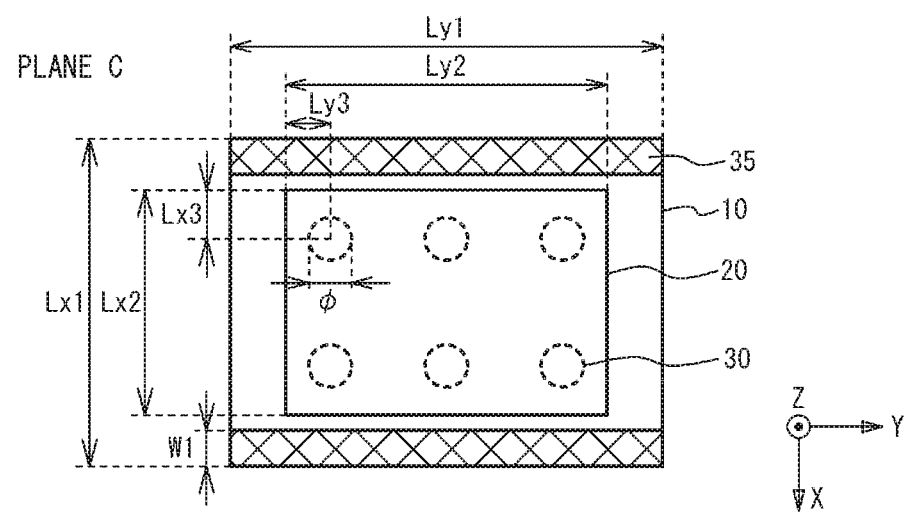

FIG. 2A through FIG. 2C are plan views of the samples used for the simulation. As illustrated in FIG. 2A, in a plane A, the embedded layer 35 is not embedded in the upper surface of the piezoelectric substrate 10. Six bumps 30 are substantially symmetrically provided. The piezoelectric substrate 10 and the substrate 20 have rectangular planar shapes. The direction in which the shorter side of the piezoelectric substrate 10 extends is defined as an X direction, and the direction in which the longer side of the piezoelectric substrate 10 extends is defined as a Y direction. The length of the piezoelectric substrate 10 in the X direction is Lx1, and the length of the piezoelectric substrate 10 in the Y direction is Ly1. The length of the substrate 20 in the X direction is Lx2, and the length of the substrate 20 in the Y direction is Ly2. The distances between the center of each of the bumps 30 located at four corners of the substrate 20 and the end of the substrate 20 in the X direction and the Y direction are respectively Lx3 and Ly3. The bump 30 has a diameter of φ.

As illustrated in FIG. 2B, in a plane B, the embedded layer 35 is embedded along four sides of the piezoelectric substrate 10. The embedded layer 35 has a width of W1. Other structures are the same as those of the plane A.

As illustrated in FIG. 2C, in a plane C, the embedded layers 35 are embedded along two longer sides of the piezoelectric substrate 10. No embedded layer 35 is provided along two shorter sides. The embedded layer 35 has a width of W1. Other structures are the same as those of the plane A.

FIG. 3A and FIG. 3B present materials and dimensions of the samples used for the simulation. As presented in FIG. 3A, the piezoelectric substrate 10 is made of lithium tantalate (LT), and the support substrate 11 is made of sapphire.

Lx1 is 0.78 mm, and Ly1 is 0.98 mm. The substrate 20 is made of silicon (Si). Lx2 is 0.6 mm, Ly2 is 0.8 mm, and T3 is 0.15 mm. The bump 30 is made of gold (Au). Lx3 is 123 μm, Ly3 is 70 μm, φ is 80 μm, and H1 is 15 μm. The width W1 of the embedded layer 35 is 55 μm.

As presented in FIG. 3B, samples 1 through 8 were simulated. The sample 1 has the cross-section A and the plane A without the embedded layer 35. The samples 2 and 3 have the cross-section B where the piezoelectric substrate 10 is not bonded on the support substrate 11. The sample 2 has the plane B where the embedded layer 35 is provided along four sides of the upper surface of the piezoelectric substrate 10. The sample 3 has the plane C where the embedded layers 35 are provided along the longer sides of the upper surface of the piezoelectric substrate 10. The samples 4 through 8 have the cross-section C where the piezoelectric substrate 10 is bonded on the support substrate 11. The samples 4, 6, and 8 have the plane B where the embedded layer 35 is provided along four sides of the upper surface of the piezoelectric substrate 10. The samples 5 and 7 have the plane C where the embedded layers 35 are provided along the longer sides of the upper surface of the piezoelectric substrate 10. In the samples 2, 3, and 5 through 8, the embedded layer 35 is made of tungsten (W). In the sample 4, the embedded layer 35 is made of copper (Cu).

FIG. 4 presents the Young's modulus, the Poisson's ratio, and the linear thermal expansion coefficient of each material used for the simulation. As presented in FIG. 4, the linear thermal expansion coefficient of the lithium tantalate substrate differs depending on the crystal orientation. X, Y, and Z respectively represent the linear thermal expansion coefficients in the X-axis orientation, the Y-axis orientation, and the Z-axis orientation of the crystal orientation. The linear thermal expansion coefficient in the X-axis orientation is the greatest, and the linear thermal expansion coefficient in the Y-axis orientation is the smallest. Gold and copper have linear thermal expansion coefficients approximately equal to the linear thermal expansion coefficient in the X-axis orientation of lithium tantalate. Sapphire, silicon, and tungsten have linear thermal expansion coefficients less than the linear thermal expansion coefficient in the Y-axis orientation of lithium tantalate. Gold and copper have Young's moduluses less than the Young's modulus of lithium tantalate. Sapphire and tungsten have Young's moduluses greater than the Young's modulus of lithium tantalate.

Figure 5:
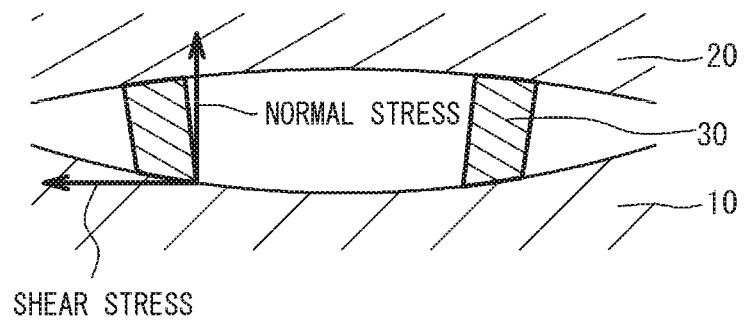
FIG. 5 illustrate a simulated stress.

FIG. 5 illustrates a simulated stress. The stress concentrates to the surface closer to the piezoelectric substrate 10 of each of the bumps 30 located at four corners in plan view. Thus, for one of the bumps 30 located at four corners, the greatest normal stress and the greatest shear stress at the surface where the bump 30 is in contact with the piezoelectric substrate 10 were simulated. Simulated was the stress for the following case. The substrate 20 is heated to 80° C., while the piezoelectric substrate 10 is heated to 230° C. Thereafter, the substrate 20 is flip-chip mounted to the piezoelectric substrate 10 and then cooled to 25° C. and −40° C.

Figure 6:
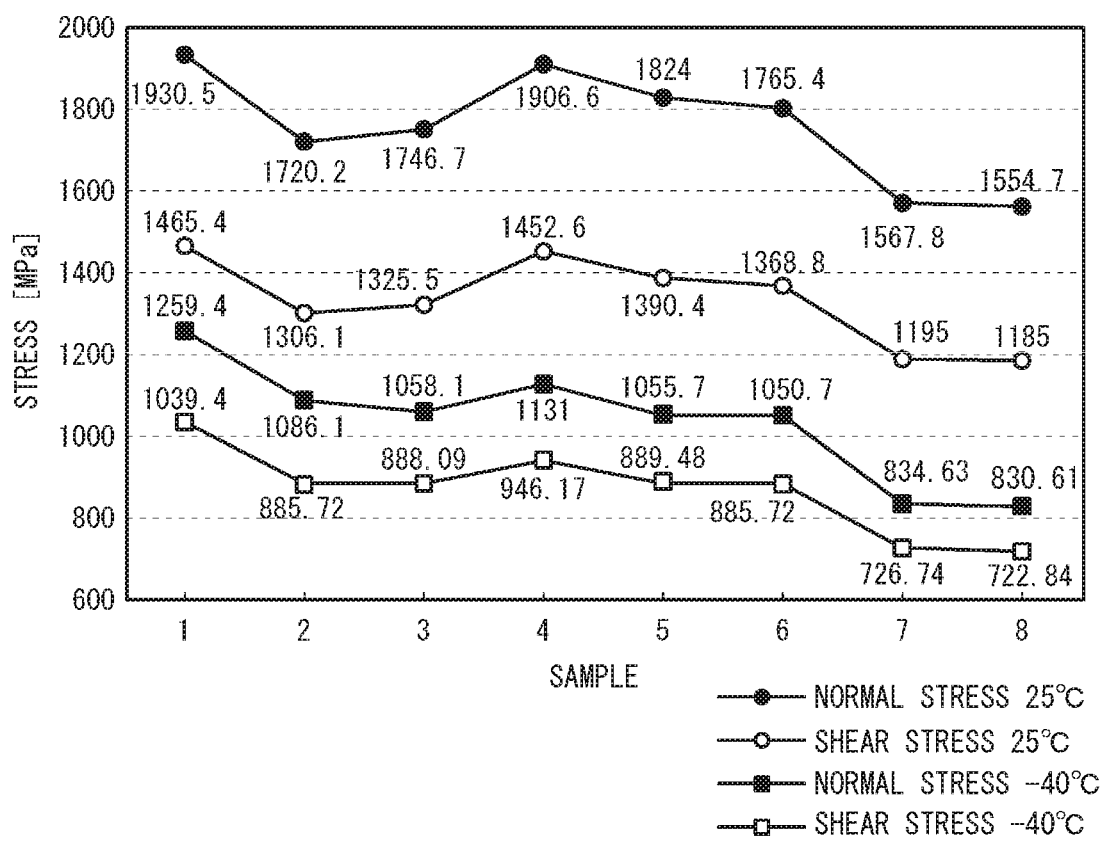
FIG. 6 illustrates results of the simulation.

FIG. 6 illustrates results of the simulation. Dots represent simulation results, and numbers indicate stress values. As illustrated in FIG. 6, compared to the sample 1 without the embedded layer 35, the stresses in the samples 2 and 3 with the embedded layer 35 made of tungsten are small. Also in the samples 5 through 8 where the support substrate 11 is provided, the provision of the embedded layer 35 made of tungsten reduces the stress. The stress in the sample 4 with the embedded layer 35 made of copper is approximately equal to that in the sample 1. The stresses in the samples 2, 6, and 8 having the plane B where the embedded layer 35 is provided along four sides are little different from the stresses in the samples 3, 5, and 7 having the plane C where the embedded layers 35 are provided only along the longer sides. When the thickness T1 of the piezoelectric substrate 10 is reduced as in the samples 7 and 8, the stress becomes smaller than those in the samples 5 and 6.

The above simulation reveals that the piezoelectric substrate 10 warps due to the difference in linear thermal expansion coefficient between the piezoelectric substrate 10 and the substrate 20 or the like in the sample 1 without the embedded layer 35. Thus, a large stress is applied to the bumps 30. The embedded layer 35 embedded in a recessed portion provided on the upper surface of the piezoelectric substrate 10 reduces the stress applied to the bump 30. The piezoelectric substrate 10 has a large linear thermal expansion coefficient, thus shrinking when the temperature becomes low. Thus, in the sample 1, the stress at the boundary face between the bump 30 and the piezoelectric substrate 10 becomes large. In the samples 2, 3, and 5 through 8, the side surface of the embedded layer 35, which has a less linear thermal expansion coefficient than the piezoelectric substrate 10, is in contact with the side surface of the recessed portion in the piezoelectric substrate 10. This structure inhibits the piezoelectric substrate 10 from shrinking. Thus, the warpage of the piezoelectric substrate 10 is reduced, and thus the stress applied to the bump 30 is reduced.

Based on the above simulation results, embodiments will be described.

First Embodiment

Figure 7A:
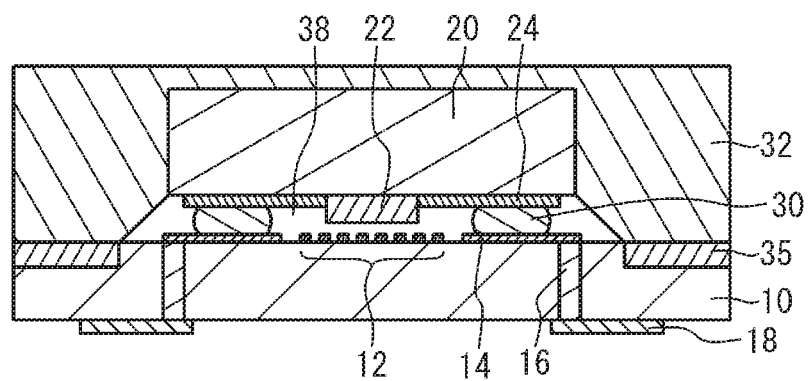
FIG. 7A through FIG. 7C are cross-sectional views of acoustic wave devices in accordance with a first embodiment and variations thereof.

FIG. 7A is a cross-sectional view of an acoustic wave device in accordance with a first embodiment. As illustrated in FIG. 7A, an acoustic wave element 12 and wiring lines 14 are located on the upper surface of the piezoelectric substrate 10. The wiring line 14 is electrically connected to the acoustic wave element 12. Terminals 18 are located on the lower surface of the piezoelectric substrate 10. The terminal 18 is a foot pad for connecting the acoustic wave element 12 to an external device through the wiring line 14. Via wirings 16 penetrating through the piezoelectric substrate 10 are provided. The via wiring 16 electrically connects the wiring line 14 and the terminal 18. The wiring lines 14, the via wirings 16, and the terminals 18 are formed of, for example, a metal layer such as a copper layer, an aluminum layer, or a gold layer.

A recessed portion is formed in the periphery of the upper surface of the piezoelectric substrate 10, and the embedded layer 35 is embedded in the recessed portion. The embedded layer 35 is made of a material that has a less linear thermal expansion coefficient than the piezoelectric substrate 10 and a larger Young's modulus than the piezoelectric substrate 10. When the piezoelectric substrate 10 is a lithium tantalate substrate or a lithium niobate substrate, for example, tungsten, molybdenum, tantalum, or titanium, an alloy of at least two of them, or a multilayered film of at least two of them is adopted as the above material.

An acoustic wave element 22 and wiring lines 24 are located on the lower surface of the substrate 20. The substrate 20 is, for example, a silicon substrate, a sapphire substrate, a spinel substrate, or an alumina substrate. The wiring line 24 is formed of a metal layer such as, for example, a copper layer, an aluminum layer, or a gold layer. The substrate 20 is flip-chip mounted (face-down mounted) on the piezoelectric substrate 10 through the bumps 30. The bump 30 is, for example, a gold bump, a solder bump, or a copper bump. The bump 30 bonds the wiring line 14 to the wiring line 24.

A sealing portion 32 is located on the piezoelectric substrate 10 so as to surround the substrate 20. The sealing portion 32 is formed of a resin layer made of epoxy resin or the like. The acoustic wave elements 12 and 22 face each other across an air gap 38. The bump 30 is surrounded by the air gap 38.

First Variation of the First Embodiment

Figure 7B:
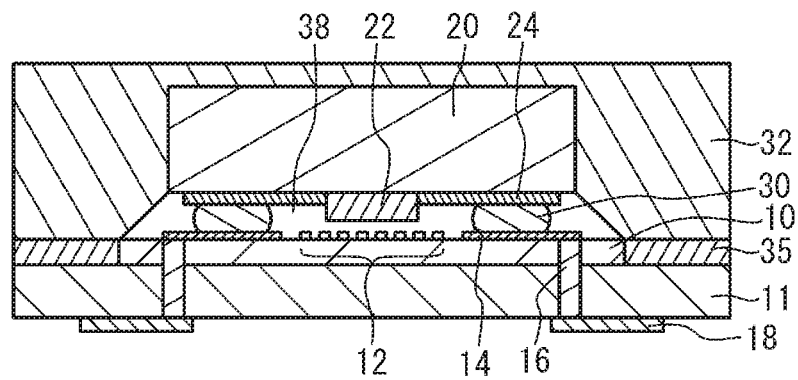

FIG. 7B is a cross-sectional view of an acoustic wave device in accordance with a first variation of the first embodiment. As illustrated in FIG. 7B, the piezoelectric substrate 10 is bonded on the upper surface of the support substrate 11. The support substrate 11 is, for example, a sapphire substrate, an alumina substrate, a spinel substrate, or a silicon substrate. The piezoelectric substrate 10 is, for example, a tantalum lithium substrate or a lithium niobate substrate. The embedded layer 35 is located in the recessed portion penetrating through the piezoelectric substrate 10, and the lower surface of the embedded layer 35 is in contact with the upper surface of the support substrate 11. The via wiring 16 penetrates through the piezoelectric substrate 10 and the support substrate 11. Other structures are the same as those of the first embodiment, and the description thereof is thus omitted.

Second Variation of the First Embodiment

Figure 7C:
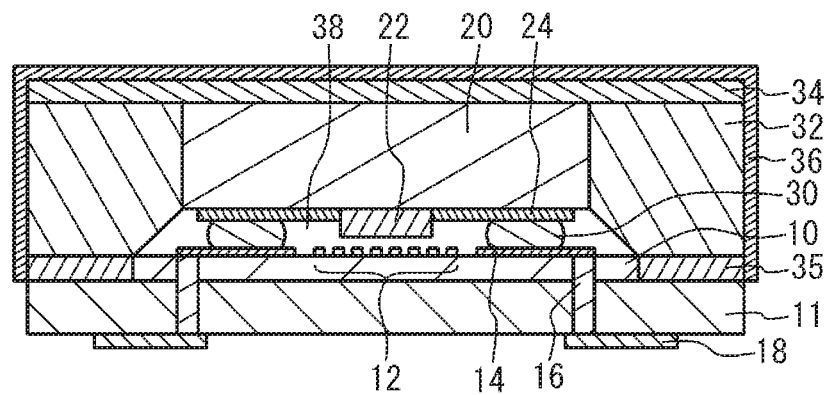

FIG. 7C is a cross-sectional view of an acoustic wave device in accordance with a second variation of the first embodiment. As illustrated in FIG. 7C, a lid 34 is located on the upper surfaces of the sealing portion 32 and the substrate 20. The sealing portion 32 may be located between the upper surface of the substrate 20 and the lid 34. A protective film 36 is provided so as to cover the lid 34, the sealing portion 32, and the embedded layer 35. The sealing portion 32 is formed of a metal layer made of, for example, SnAg solder. The lid 34 is a metal plate such as a kovar plate or an insulator plate. The protective film 36 is a metal film such as a nickel film or an insulator film. Other structures are the same as those of the first variation of the first embodiment, and the description thereof is thus omitted.

Figure 8A:
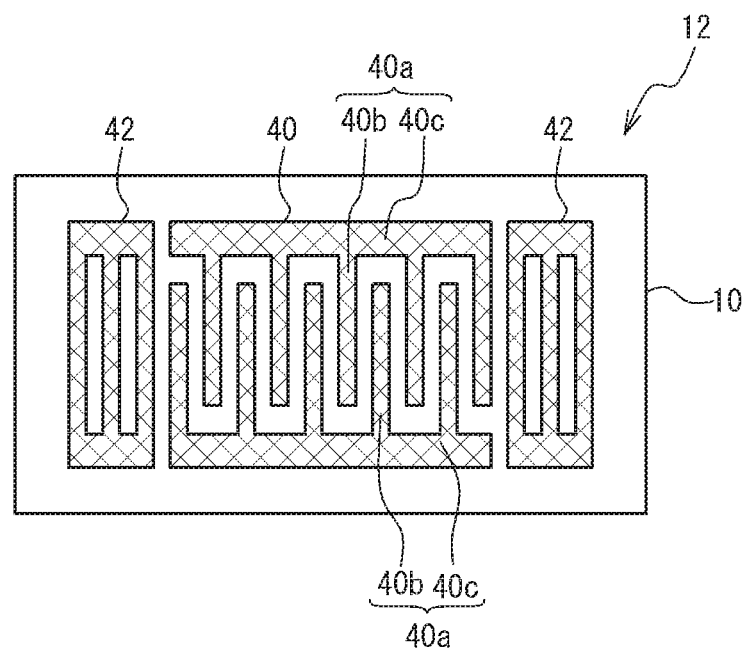
FIG. 8A and FIG. 8B are plan views of the acoustic wave elements in the first embodiment and the variation thereof.
Figure 8B:
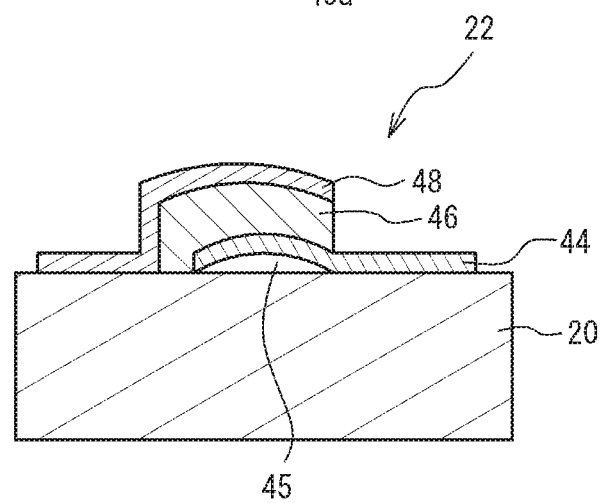

FIG. 8A and FIG. 8B are plan views of the acoustic wave elements in accordance with the first embodiment and the variations thereof. As illustrated in FIG. 8A, the acoustic wave element 12 is a surface acoustic wave resonator. An Interdigital Transducer (IDT) 40 and reflectors 42 are formed on the piezoelectric substrate 10. The IDT 40 has a pair of comb-shaped electrodes 40a facing each other. The comb-shaped electrode 40a has electrode fingers 40b and a bus bar 40c connecting the electrode fingers 40b. The reflectors 42 are located at both sides of the IDT 40. The IDT 40 excites a surface acoustic wave on the piezoelectric substrate 10. The IDT 40 and the reflectors 42 are formed of, for example, an aluminum film or a copper film. A protective film or a temperature compensation film may be provided on the piezoelectric substrate 10 so as to cover the IDT 40 and the reflectors 42.

As illustrated in FIG. 8B, the acoustic wave element 22 is a piezoelectric thin film resonator. A piezoelectric film 46 is located on the substrate 20. A lower electrode 44 and an upper electrode 48 are located so as to sandwich the piezoelectric film 46. An air gap 45 is formed between the lower electrode 44 and the substrate 20. The lower electrode 44 and the upper electrode 48 excite the acoustic wave in the thickness extension mode in the piezoelectric film 46. The lower electrode 44 and the upper electrode 48 are formed of a metal film such as, for example, a ruthenium film, and the piezoelectric film 46 is, for example, an aluminum nitride film.

The acoustic wave elements 12 and 22 include electrodes exciting the acoustic wave. Thus, the acoustic wave elements 12 and 22 are covered with the air gap 38 so as not to restrain the excitation of the acoustic wave.

In the first embodiment and the variations thereof, the acoustic wave element 12 and the bumps 30 are located on the piezoelectric substrate 10 (a first substrate made of a piezoelectric material). The substrate 20 (a second substrate) is located on the piezoelectric substrate 10 through the bumps 30, and faces the piezoelectric substrate 10 across the air gap 38. The embedded layer 35 is located in at least a part of the periphery of the piezoelectric substrate 10 and is in contact with the side surface of the piezoelectric substrate 10, and has a less linear expansion coefficient than the piezoelectric substrate 10. As illustrated in FIG. 7A through FIG. 7C, the recessed portion may be a level difference. One of the opposing side surfaces of the embedded layer 35 may be in contact with the piezoelectric substrate 10, and the other of the opposing side surfaces may not be necessarily in contact with the piezoelectric substrate 10. Both opposing side surfaces of the embedded layer 35 may be in contact with the piezoelectric substrate 10. The embedded layer 35 is a support layer that supports the piezoelectric substrate 10 by having the side surface being in contact with the piezoelectric substrate 10.

As described above, the substrate 20 is flip-chip mounted on the upper surface of the piezoelectric substrate 10 having the acoustic wave element 12 formed on the upper surface thereof with use of the bumps 30. The embedded layer 35 is embedded in the recessed portion located on the upper surface of at least a part of the periphery of the piezoelectric substrate 10, and has the side surface being in contact with the side surface of the recessed portion. The embedded layer 35 has a linear thermal expansion coefficient less than the linear thermal expansion coefficient of the piezoelectric substrate 10. Thus, the stress applied to the bump 30 by the piezoelectric substrate 10 having a larger linear thermal expansion coefficient is reduced. When the linear thermal expansion coefficient of the piezoelectric substrate 10 differs depending on the crystal orientation, the linear thermal expansion coefficient of the embedded layer 35 is preferably less than the largest linear thermal expansion coefficient in the upper surface of the piezoelectric substrate 10. Additionally, the linear thermal expansion coefficient of the embedded layer 35 is preferably less than the smallest linear thermal expansion coefficient in the upper surface of the piezoelectric substrate 10. The linear thermal expansion coefficient of the embedded layer 35 is preferably two-thirds of or less than two-thirds of, more preferably a half of or less than a half of the linear thermal expansion coefficient of the piezoelectric substrate 10.

To further reduce the shrinkage of the piezoelectric substrate 10 by the embedded layer 35, the Young's modulus (the rigidity) of the embedded layer 35 is preferably greater than the Young's modulus (the rigidity) of the piezoelectric substrate 10. The Young's modulus of the embedded layer 35 is preferably 1.2 times or more than 1.2 times, more preferably 1.5 times or more than 1.5 times the Young's modulus of the piezoelectric substrate 10.

When the piezoelectric substrate 10 has a rectangular planar shape as illustrated in FIG. 2C, the piezoelectric substrate 10 tends to shrink most in the longer side direction. Thus, the embedded layers 35 are provided along the longer sides of the piezoelectric substrate 10. This structure further reduces the stress applied to the bump 30. The embedded layers 35 preferably overlap with the bumps 30 as viewed from the shorter side direction, and are more preferably provided along the entire longer sides.

As illustrated in FIG. 2B, the embedded layer 35 is provided along four sides of the piezoelectric substrate 10. This structure further reduces the stress applied to the bump 30.

In the first and second variations of the first embodiment, the support substrate 11 (a third substrate) has the upper surface on which the piezoelectric substrate 10 is bonded (i.e., the upper surface directly bonded on the opposite surface of the piezoelectric substrate 10 from the surface on which the bump 30 is bonded), and has a linear thermal expansion coefficient less than the linear thermal expansion coefficient of the piezoelectric substrate 10. This structure allows the support substrate 11 in addition to the embedded layer 35 to reduce the shrinkage of the piezoelectric substrate 10. Thus, the stress applied to the bump 30 is able to be further reduced. The support substrate 11 and the piezoelectric substrate 10 are preferably bonded with each other at room temperature.

The lower surface of the embedded layer 35 may not be necessarily in contact with the upper surface of the support substrate 11, but is preferably in contact with the upper surface of the support substrate 11. This structure makes the piezoelectric substrate 10 be surrounded by the embedded layer 35 and the support substrate 11 in cross-section view. Thus, the stress applied to the bump 30 is further reduced.

When the piezoelectric substrate 10 is a lithium tantalate substrate or a lithium niobate substrate, the piezoelectric substrate 10 has a large linear thermal expansion coefficient. Thus, the embedded layer 35 is preferably embedded in the piezoelectric substrate 10.

When used as the piezoelectric substrate 10 is a rotated Y-cut X-propagation lithium tantalate substrate or a rotated Y-cut X-propagation lithium niobate substrate, the embedded layer 35 preferably extends in the X-axis orientation in which the linear thermal expansion coefficient is the greatest. This structure further reduces the stress applied to the bump 30.

In the first embodiment and the variations thereof, the sealing portion 32 is provided so as to surround the substrate 20 in plan view, and is bonded to the upper surface of the embedded layer 35. The sealing portion may not be necessarily provided as in the structure used for the simulation.

When the bump 30 is surrounded by the air gap 38, the bump 30 is easily damaged. Thus, in this case, the embedded layer 35 is preferably embedded in the piezoelectric substrate 10.

When the substrate 20 has a linear thermal expansion coefficient less than the linear thermal expansion coefficient of the piezoelectric substrate 10, the stress is easily applied to the bump 30 due to the difference in linear thermal expansion coefficient between the piezoelectric substrate 10 and the substrate 20. Thus, the embedded layer 35 is preferably embedded in the piezoelectric substrate 10.

A case where the acoustic wave element 22 is located on the lower surface of the substrate 20 is described, but the acoustic wave element 22 may not be necessarily located on the lower surface of the substrate 20. For example, an active element such as an amplifier and/or a switch may be located on the lower surface of the substrate 20. Alternatively, a passive element such as an inductor and/or a capacitor may be located on the lower surface of the substrate 20.

At least one of the acoustic wave elements 12 and 22 may be a filter. Both of the acoustic wave elements 12 and 22 may be filters, and the acoustic wave device may be a multiplexer such as a duplexer.

Figure 9A:
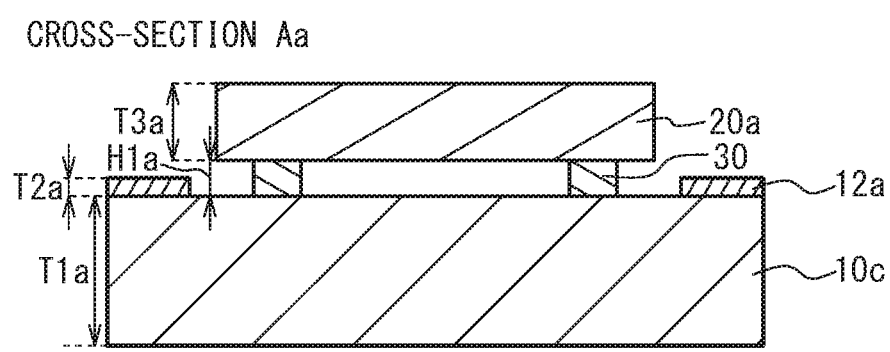
FIG. 9A and FIG. 9B are cross-sectional views of other samples used for a simulation.
Figure 9B:
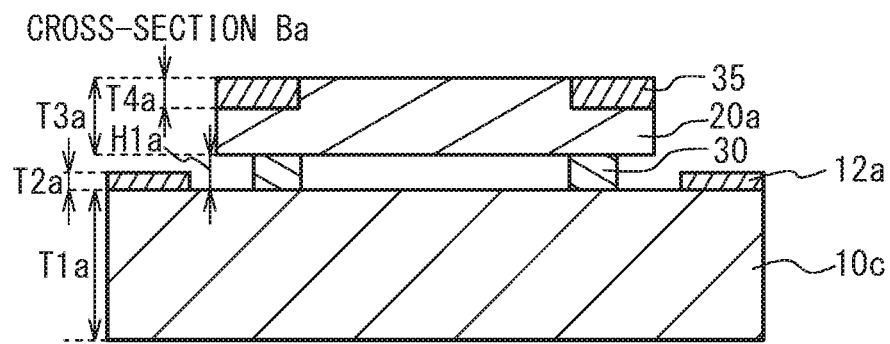

A stress applied to a bump was simulated for other samples in which a piezoelectric substrate is flip-chip mounted on a substrate. FIG. 9A and FIG. 9B are cross-sectional views of samples used for a simulation. As illustrated in FIG. 9A, in a cross-section Aa, a substrate 20a is flip-chip mounted on a substrate 10c with use of the bumps 30. The substrate 20a is a piezoelectric substrate. A ring-shaped metal layer 12a is located in the periphery of the upper surface of the substrate 10c. The substrate 10c has a thickness of T1a, the ring-shaped metal layer 12a has a thickness of T2a, the substrate 20a has a thickness of T3a, and the bump 30 has a height of H1a.

As illustrated in FIG. 9B, in a cross-section Ba, the embedded layer 35 is embedded in the upper surface of the substrate 20a. The embedded layer 35 has a thickness of T4a. Other structures are the same as those of the cross-section A.

FIG. 10A through FIG. 10D are plan views of the samples used for the simulation. As illustrated in FIG. 10A, in a plane Aa, the embedded layer 35 is not embedded in the upper surface of the substrate 20a. Six bumps 30 are substantially symmetrically provided. The ring-shaped metal layer 12a is located in the periphery of the substrate 10c. The substrate 10c and the piezoelectric substrate 20a have rectangular planar shapes. The direction in which the shorter side of the substrate 10c extends is defined as the X direction, and the direction in which the longer side of the substrate 10c extends is defined as the Y direction. A stacking direction is defined as a Z direction. The X direction, the Y direction, and the Z direction do not necessarily correspond to the crystal orientation of the piezoelectric substrate. The length of the substrate 10c in the X direction is Lx1a, and the length of the substrate 10c in the Y direction is Ly1a. The length of the substrate 20a in the X direction is Lx2a, and the length of the substrate 20a in the Y direction is Ly2a. The distances between the center of each of the bumps 30 located at four corners of the substrate 20a and the ends of the substrate 20a in the X direction and the Y direction are respectively Lx3a and Ly3a. The bump 30 has a diameter of φ. The ring-shaped metal layer 12a has a width of W1a.

As illustrated in FIG. 10B, in a plane Ba, the embedded layer 35 is embedded along four sides of the substrate 20a. The embedded layer 35 has a width of W2a. Other structures are the same as those of the plane Aa.

As illustrated in FIG. 10C, in a plane Ca, three embedded layers 35 are embedded in the upper surface of the substrate 20a. Two embedded layers 35 are located along two longer sides of the substrate 20a. One embedded layer 35 is located in the middle in the shorter side direction of the substrate 20a. The embedded layer 35 has a width of W2a. Other structures are the same as those of the plane Aa.

As illustrated in FIG. 10D, in a plane Da, in addition to the embedded layer 35 of the plane C, the embedded layer 35 extending in the extension direction of the shorter side is located in the middle in the longer side direction. Other structures are the same as those of the plane C.

FIG. 11A and FIG. 11B present materials and dimensions of the samples used for the simulation. As presented in FIG. 11A, the substrate 10c is made of High Temperature Co-Fired Ceramic (HTCC). Lx1a is 0.78 mm, Ly1a is 0.98 mm, and the thickness T1a is 0.12 mm. The substrate 20a is made of lithium titanate (LT). L$x2a$ is 0.66 mm, L$y2a$ is 0.86 mm, and T$3a$ is 0.15 mm. The bump 30 is made of gold (Au). L$x3a$ is 155 μm, L$3ya$ is 130 μm, φ is 80 μm, and H$1a$ is 15 μm. The ring-shaped metal layer 12$a$ is made of tungsten (W). The width W$1a$ and the thickness T$2a$ of the ring-shaped metal layer 12$a$ are respectively 55 μm and 20 μm. The embedded layer 35 is made of tungsten. The width W$2a$ and the thickness T$4a$ of the embedded layer 35 are respectively 55 μm and 30 μm.

As illustrated in FIG. 11B, samples 1a through 4a were simulated. The sample 1a has the cross-section Aa and the plane Aa where the embedded layer 35 is not provided. The samples 2a through 4a have the cross-section Ba where the embedded layer 35 is embedded in the upper surface of the substrate 20$a$. The samples 2a through 4a respectively have the planes Ba through Da.

FIG. 12 presents the Young's modulus, the Poisson's ratio, and the linear thermal expansion coefficient of each material used for the simulation. As presented in FIG. 12, the linear thermal expansion coefficient of the lithium tantalate substrate differs depending on the crystal orientation. X, Y, and Z respectively represent linear thermal expansion coefficients in the X-axis orientation, the Y-axis orientation, and the Z-axis orientation of the crystal orientation. The linear thermal expansion coefficient in the X-axis orientation is the greatest, and the linear thermal expansion coefficient in the Y-axis orientation is the smallest. Gold has a linear thermal expansion coefficient approximately equal to the linear thermal expansion coefficient in the X-axis orientation of lithium tantalate. HTCC and tungsten have linear thermal expansion coefficients less than the linear thermal expansion coefficient in the Y-axis orientation of lithium tantalate. Gold has a Young's modulus less than the Young's modulus of lithium tantalate. Tungsten has a Young's modulus less than the Young's modulus of lithium tantalate.

Figure 13:
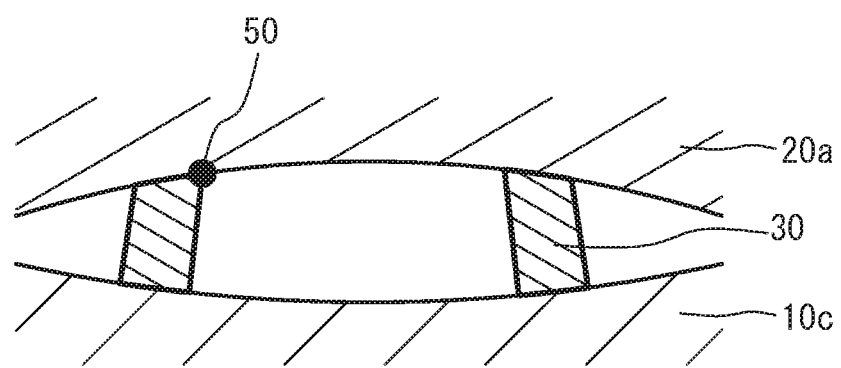
FIG. 13 illustrates a location at which stress was simulated.

FIG. 13 illustrates a location at which stress was simulated. The stress concentrates to the surface closer to the substrate 20$a$ of each of the bumps 30 located at four corners in plan view. Thus, for one of the bumps 30 located at four corners, the stress at a location 50 to which the stress concentrates most (i.e., the stress is the greatest) on the surface where the bump 30 is in contact with the substrate 20$a$ was simulated. Simulated was the stress for the following case. The substrate 10$c$ is heated to 80° C. and the substrate 20$a$ is heated to 230° C. Thereafter, the substrate 20$a$ is flip-chip mounted on the substrate 10$c$, and then cooled to 25° C.

Figure 14:
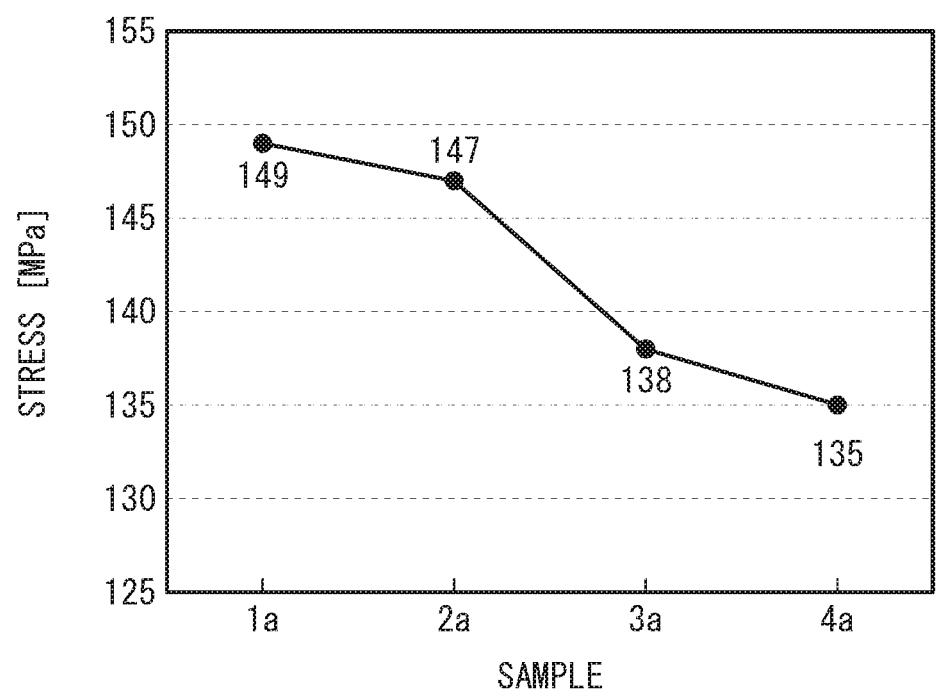
FIG. 14 illustrates results of the simulation.

FIG. 14 illustrates results of the simulation. Dots indicate simulation results, and numbers indicate stress values. As illustrated in FIG. 14, the stress applied to the bump 30 decreases in the order of the samples 1a through 4a. The comparison between the sample 1a and the samples 2a through 4a reveals that the stress applied to the bump 30 decreases when the embedded layer 35 is embedded in the upper surface of the substrate 20$a$. The stress in the sample 3a is smaller than that in the sample 2a. Based on these results, it is considered that the stress applied to the bump 30 is decreased by embedding the embedded layer 35 in the middle. The stress differs little between the samples 3 and 4. Thus, it is considered that the stress in the structure where the embedded layer 35 extends in the extension direction of the longer side is less than the stress in the structure where the embedded layer 35 extends in the extension direction of the shorter side.

The above simulation indicates that in the sample 1a without the embedded layer 35, the substrate 20$a$ warps due to the difference in linear thermal expansion coefficient between the substrate 10$c$ and the substrate 20$a$. Thus, a large stress is applied to the bump 30. The stress applied to the bump 30 is reduced by embedding the embedded layer 35 in the recessed portion formed on the upper surface of the substrate 20$a$. Since the substrate 20$a$ has a large linear thermal expansion coefficient, the substrate 20$a$ shrinks as the temperature decreases. Because of this, in the sample 1a, the stress at the boundary face between the bump 30 and the substrate 20$a$ becomes large. In the samples 2a through 4a, the side surface of the embedded layer 35 having a less linear thermal expansion coefficient than the substrate 20$a$ is in contact with the side surface of the recessed portion in the substrate 20$a$. This structure reduces the shrinkage of the substrate 20$a$. Thus, the warpage of the substrate 20$a$ is reduced, and the stress applied to the bump 30 is thereby reduced.

Based on the above simulation results, an example will be described.

First Example

Figure 15:
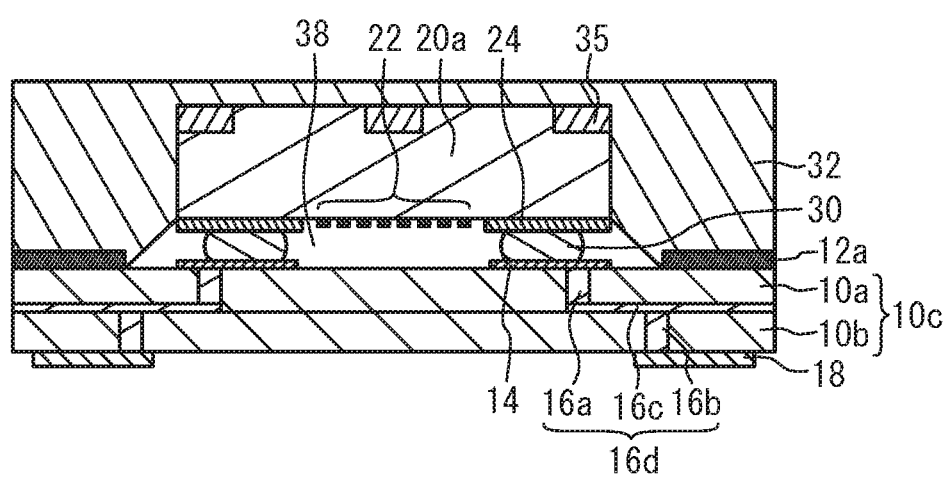
FIG. 15 is a cross-sectional view of an acoustic wave device in accordance with a first example.

FIG. 15 is a cross-sectional view of an acoustic wave device in accordance with a first example. As illustrated in FIG. 15, the substrate 10$c$ includes insulating layers 10$a$ and 10$b$. The substrate 10$c$ is an HTCC substrate, a ceramic substrate made of Low Temperature Co-fired Ceramics (LTCC), or a resin substrate. The wiring lines 14 are located on the upper surface of the substrate 10$c$. The terminals 18 are located on the lower surface of the substrate 10$c$. Internal wiring lines 16$d$ have via wirings 16$a$ and 16$b$ and wiring lines 16$c$. The via wirings 16$a$ and 16$b$ respectively penetrate through the insulating layers 10$a$ and 10$b$. The internal wiring line 16$d$ is located between the insulating layers 10$a$ and 10$b$. The internal wiring line 16$d$ electrically connects the wiring line 14 to the terminal 18. The wiring line 14, the internal wiring line 16$d$, and the terminal 18 are formed of, for example, a metal layer such as a copper layer, an aluminum layer, or a gold layer.

The acoustic wave element 22 and the wiring line 24 are located on the lower surface of the substrate 20$a$. The substrate 20$a$ is a lithium tantalate substrate or a lithium niobate substrate. The wiring line 24 is formed of a metal layer such as, for example, a copper layer, an aluminum layer, or a gold layer. The substrate 20$a$ is flip-chip mounted (face-down mounted) on the substrate 10$c$ through the bump 30. The bump 30 is, for example, a gold bump, a solder bump, or a copper bump. The bump 30 bonds the wiring line 14 to the wiring line 24.

A recessed portion is formed on the upper surface of the substrate 20$a$, and the embedded layer 35 is embedded in the recessed portion. The embedded layer 35 is made of a material having a less linear thermal expansion coefficient than the substrate 20$a$ and a larger Young's modulus than the substrate 20$a$. When the substrate 20$a$ is a lithium tantalate substrate or a lithium niobate substrate, for example, tungsten, molybdenum, tantalum, or titanium, an alloy of at least two of them, or a multilayered film of at least two of them may be used as the above material.

The sealing portion 32 is located on the substrate 10$c$ so as to surround the substrate 20$a$. The sealing portion 32 is formed of a resin layer made of epoxy resin or the like. The acoustic wave element 22 faces the upper surface of the substrate 10$c$ across the air gap 38. The bump 30 is surrounded by the air gap 38.

Although the embodiments of the present invention have been described in detail, it is to be understood that the various change, substitutions, and alterations could be made hereto without departing from the spirit and scope of the invention.

What is claimed is:

1. An acoustic wave device comprising:
    a piezoelectric substrate made of a piezoelectric material, the piezoelectric substrate having a recess located at a part of a periphery of the piezoelectric substrate;
    an acoustic wave element located on the piezoelectric substrate;
    a bump located on the piezoelectric substrate;
    a first substrate located on the piezoelectric substrate through the bump, the first substrate facing the piezoelectric substrate across an air gap; and
    a support layer that is embedded in the recess, is in contact with a side surface of the recess, and has a less linear thermal expansion coefficient than the piezoelectric substrate.

2. The acoustic wave device according to claim 1, wherein the piezoelectric substrate has a rectangular planar shape, and
    the support layer is located along a longer side of the piezoelectric substrate and no support layer located along a shorter side of the piezoelectric layer.

3. The acoustic wave device according to claim 1, wherein the piezoelectric substrate has a rectangular planar shape, and
    the support layer is located along four sides of the piezoelectric substrate.

4. The acoustic wave device according to claim 1, wherein the piezoelectric substrate is a lithium tantalate substrate or a lithium niobate substrate.

5. The acoustic wave device according to claim 1, further comprising:
    a sealing portion that is provided so as to surround the first substrate in plan view, and is bonded on an upper surface of the support layer and is not bonded the piezoelectric layer.

6. The acoustic wave device according to claim 1, wherein the bump is surrounded by the air gap and is contact with the air gap.

7. The acoustic wave device according to claim 1, wherein the first substrate has a less linear thermal expansion coefficient than the piezoelectric substrate.

8. The acoustic wave device according to claim 1, wherein the support layer has a Young's modulus greater than a Young's modulus of the piezoelectric substrate.

9. The acoustic wave device according to claim 1, wherein the bump is only located between a first surface that is closest to the first substrate among surfaces of the piezoelectric substrate and a second surface that is closest to the piezoelectric substrate among surfaces of the first substrate.

10. The acoustic wave device according to claim 1, further comprising:
    a second substrate that is directly bonded on an opposite surface of the piezoelectric substrate from a surface on which the bump is bonded, has a less linear thermal expansion coefficient than the piezoelectric substrate, and is greater than the piezoelectric substrate in plan view.

11. The acoustic wave device according to claim 10, wherein
    the recess penetrate the piezoelectric substrate, and
    the support layer is in contact with the second substrate.

* * * * *